United States Patent
Fukuzumi et al.

(10) Patent No.: US 8,653,577 B2
(45) Date of Patent: Feb. 18, 2014

(54) NONVOLATILE SEMICONDUCTOR MEMORY DEVICE

(75) Inventors: Yoshiaki Fukuzumi, Kanagawa-ken (JP); Hiroyasu Tanaka, Tokyo (JP); Yosuke Komori, Kanagawa-ken (JP); Megumi Ishiduki, Kanagawa-ken (JP); Masaru Kito, Kanagawa-ken (JP); Hideaki Aochi, Kanagawa-ken (JP); Ryota Katsumata, Kanagawa-ken (JP); Masaru Kidoh, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 363 days.

(21) Appl. No.: 13/003,644

(22) PCT Filed: Jul. 1, 2009

(86) PCT No.: PCT/JP2009/003057
§ 371 (c)(1),
(2), (4) Date: Jan. 11, 2011

(87) PCT Pub. No.: WO2010/004706
PCT Pub. Date: Jan. 14, 2010

(65) Prior Publication Data
US 2011/0127597 A1 Jun. 2, 2011

(30) Foreign Application Priority Data
Jul. 11, 2008 (JP) .................. 2008-181084

(51) Int. Cl.
*H01L 29/788* (2006.01)
*H01L 29/792* (2006.01)

(52) U.S. Cl.
USPC ........... 257/314; 257/315; 257/316; 257/324; 257/E29.3; 257/E29.309

(58) Field of Classification Search
USPC ............................ 257/314–316, 324, E29.309
See application file for complete search history.

(56) References Cited

U.S. PATENT DOCUMENTS

| 8,030,700 B2 * | 10/2011 | Sakamoto ............ 257/324 |
| 2007/0252201 A1 * | 11/2007 | Kito et al. ............ 257/331 |

(Continued)

FOREIGN PATENT DOCUMENTS

| JP | 2007 266143 | 10/2007 |
| JP | 2007 317874 | 12/2007 |

(Continued)

OTHER PUBLICATIONS

InternationalSearch Report issued Oct. 6, 2009 in PCT/JP09/03057 filed Jul. 1, 2009.

(Continued)

*Primary Examiner* — Allison P Bernstein
(74) *Attorney, Agent, or Firm* — Oblon, Spivak, McClelland, Maier & Neustadt, L.L.P.

(57) ABSTRACT

A nonvolatile semiconductor memory device includes: a stacked body in which insulating films and electrode films are alternately stacked; selection gate electrodes provided on the stacked body; bit lines provided on the selection gate electrodes; semiconductor pillars; connective members separated from one another; and a charge storage layer provided between the electrode film and the semiconductor pillar. One of the connective members is connected between a lower part of one of the semiconductor pillars and a lower part of another of the semiconductor pillars. The one of the semiconductor pillars passes through one of the selection gate electrodes and is connected to one of the bit lines, and the another of the semiconductor pillars passes through another of the selection gate electrodes and is connected to another of the bit lines.

4 Claims, 8 Drawing Sheets (56) References Cited

U.S. PATENT DOCUMENTS

| | | |
|---|---|---|
| 2008/0315296 A1 | 12/2008 | Tanaka et al. |
| 2010/0117137 A1 | 5/2010 | Fukuzumi et al. |
| 2010/0148237 A1 | 6/2010 | Kito et al. |
| 2010/0207195 A1* | 8/2010 | Fukuzumi et al. ............ 257/326 |
| 2011/0075481 A1 | 3/2011 | Fukuzumi et al. |
| 2011/0233644 A1 | 9/2011 | Fukuzumi et al. |

FOREIGN PATENT DOCUMENTS

| | | |
|---|---|---|
| JP | 2007 320215 | 12/2007 |
| JP | 2008-117959 | 5/2008 |
| JP | 2009 146954 | 7/2009 |

OTHER PUBLICATIONS

The Extended European Search Report issued Apr. 23, 2012, in Application No. / Patent No. 09794154.6.
Combined Office Action and Search Report issued Nov. 30, 2012 in Chinese Application No. 200980126764.2 (With English Translation).
Office Action issued on Jun. 27, 2012 in the corresponding Japanese Patent Application No. 2008-181084 (with English Translation).
Taiwanese Office Action issued on Aug. 14, 2013, in Taiwanese Patent Application No. 098123135 (with English Translation).

* cited by examiner

NONVOLATILE SEMICONDUCTOR MEMORY DEVICE

TECHNICAL FIELD

This invention relates to a nonvolatile semiconductor memory device, and particularly to a nonvolatile semiconductor memory device in which a plurality of insulating films and electrode films are alternately stacked.

BACKGROUND ART

Conventionally, semiconductor memory devices such as flash memory have been manufactured by two-dimensionally integrating elements on a surface of a silicon substrate. For increasing memory capacity of such a semiconductor memory device, miniaturization has been achieved by making the sizes of the individual elements smaller. However, in recent years, the miniaturization has become difficult in cost and technique.

For solving such problems, a number of ideas of three-dimensionally integrating elements have been proposed. For example, a memory device in which one-time-programmable elements are sandwiched among multilayer wirings, a memory device in which a plurality of layers of conventional NAND-type flash memories are formed by repeating epitaxial growth of silicon films, and so forth have been proposed. However, the three-dimensional devices require several times of lithography processes per layer, and therefore, even by the three-dimensionization, it is difficult to reduce the cost.

With conceiving such problems, the present inventors and others proposed a collectively processed three-dimensional stacked memory (see, for example, Patent Document 1). In this technique, a selection transistor in which a silicon pillar extending in the vertical direction serves as a channel is formed on a silicon substrate, and thereon, electrode films and insulating films are alternately stacked to form a stacked body, and then, through-holes are formed in the stacked body by collective processing. And, a charge storage layer is formed on the side surface of the through-hole, and a silicon pillar is buried inside the through-hole to be connected to the silicon pillar of the selection transistor. Thereby, a memory cell is formed in each of the intersection parts of the electrode films and the silicon pillars. In the collectively processed three-dimensional stacked memory, by controlling potentials of each of the electrode films and each of the silicon pillars, a charge can be transferred between the silicon pillar and the charge storage layer, and thereby, information can be recorded. According to this technique, the through-holes are formed by collective-processing of the stacked body, and therefore, even when the number of the stacked layers of the electrode films increases, the number of the lithography processes does not increase, and increase in cost can be suppressed.

However, in manufacturing the memory, when the silicon pillars are buried inside the through-holes, it is necessary to remove silicon oxide such as natural oxide film or the like from the bottom surfaces of the through-holes so that an electric contact between the newly buried silicon pillar and the silicon pillar constituting the channel of the selection transistor is improved. In general, before burying the silicon pillar in the through-hole, a pretreatment using a hydrofluoric acid type solution is performed. However, by the pretreatment, the charge storage layers are damaged, and the reliability of the charge storage layer comes to lower. For avoiding this problem, the charge storage layer is required to have a film structure to be resistant to the pretreatment. However, various technical restrictions emerge in this case. For example, in a case of introduction of a multi-value technique for more improving the memory density, film structures are restricted, and therefore, development of charge storage layers comes to be difficult.

CITATION LIST

Patent Literature

PTL 1: Patent 2007-266143

SUMMARY OF INVENTION

Technical Problem

An object of the invention is to provide a nonvolatile semiconductor memory device with charge storage layers with high reliability.

Solution to Problem

According to an aspect of the invention, there is provided a nonvolatile semi-conductor memory device including: a stacked body in which a plurality of insulating films and a plurality of electrode films are alternately stacked; a plurality of selection gate electrodes provided on the stacked body; a plurality of bit lines provided on the selection gate electrodes; a plurality of semiconductor pillars passing through the stacked body and the selection gate electrodes, whose upper ends are connected to the bit lines; a connective member connecting a lower part of one of the semiconductor pillars and a lower part of another of the semiconductor pillars; and a charge storage layer provided between the electrode film and the semiconductor pillar, the electrode film of each of the layers being divided for each of the selection gate electrodes, one pair of the semiconductor pillars connected to each other through the connective member passing through the electrode films different from each other and the selection gate electrodes different from each other, and a plurality of the connective members commonly connected to one of the bit lines being commonly connected to another of the bit lines.

Advantageous Effects of Invention

The invention provides a nonvolatile semiconductor memory device with charge storage layers with high reliability.

DESCRIPTION OF EMBODIMENTS

Hereinafter, embodiments of the invention will be described with reference to the drawings.

Figure 1:
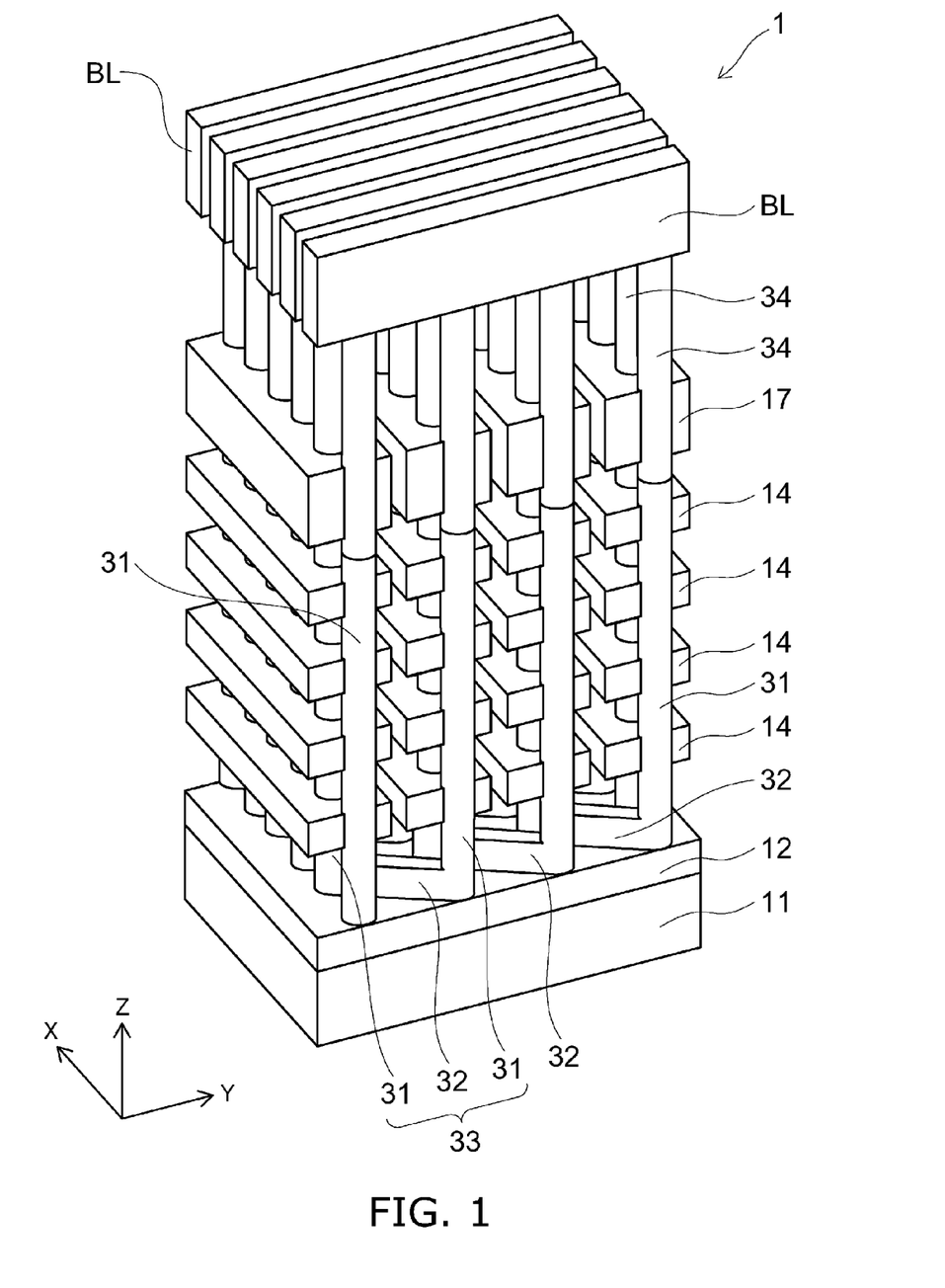
FIG. 1 is a perspective view illustrating the nonvolatile semiconductor memory device according to the first embodiment of the invention.

First, a first embodiment of the invention will be described. FIG. 1 is a perspective view illustrating the nonvolatile semiconductor memory device according to this embodiment, FIG. 2 is a plan view illustrating the nonvolatile semiconductor memory device according to this embodiment, and FIG. 3 is a cross-sectional view taken along line A-A' shown in FIG. 2.

Figure 2:
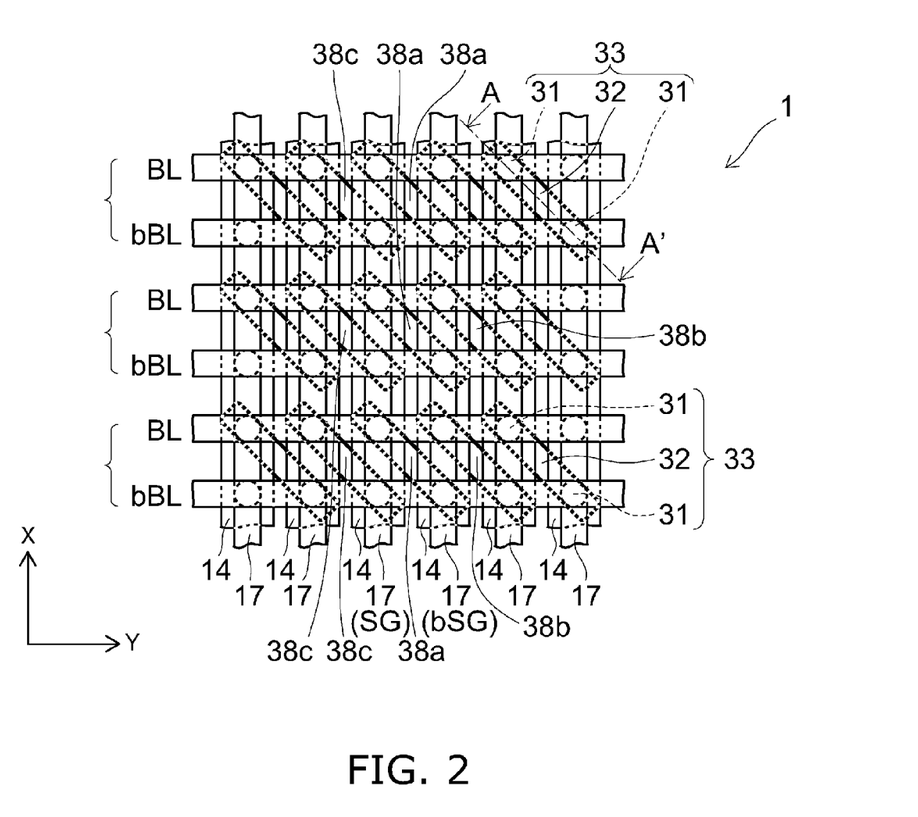
FIG. 2 is a plan view illustrating the nonvolatile semiconductor memory device according to the first embodiment.
Figure 3:
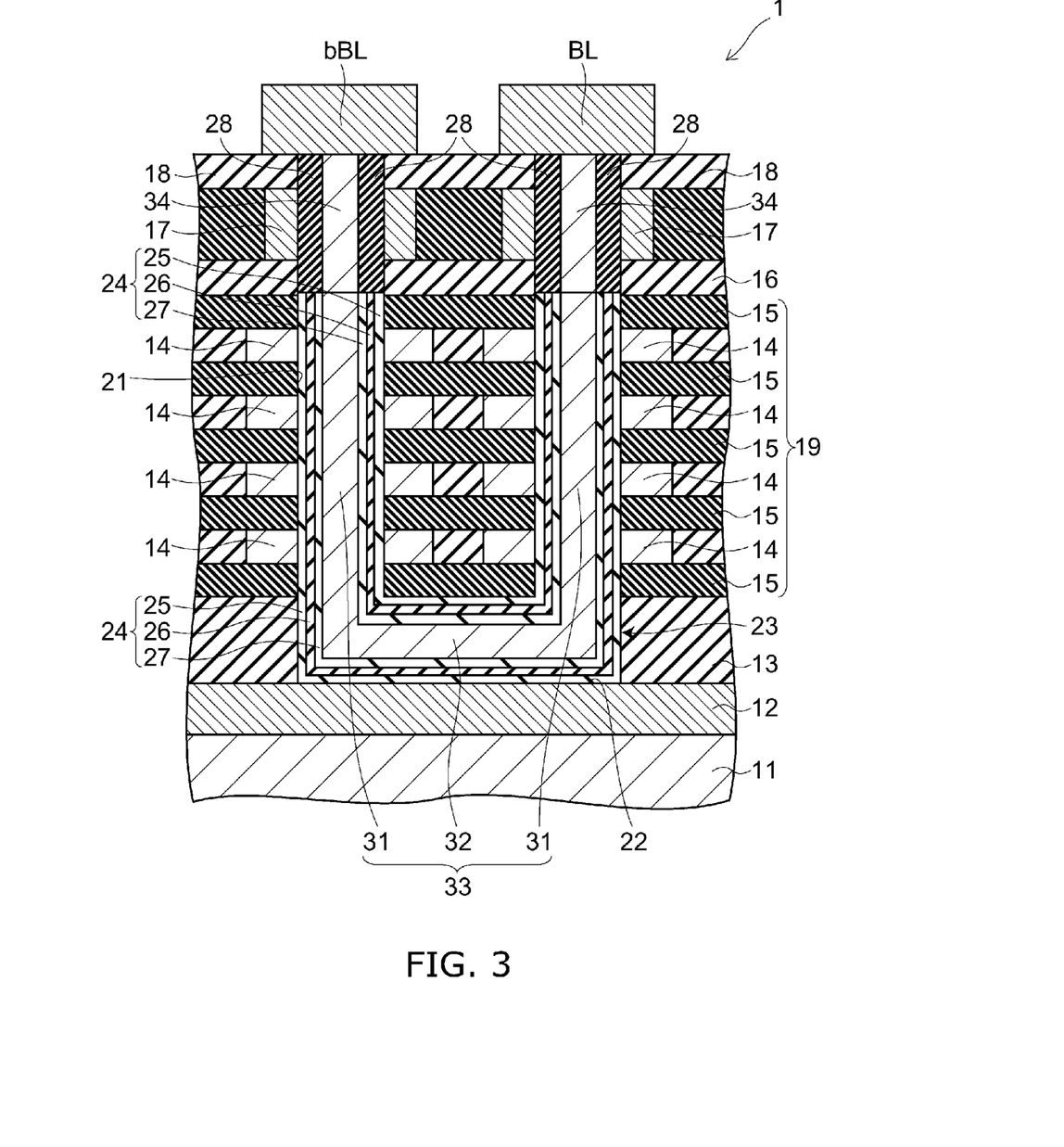
FIG. 3 is a cross-sectional view taken along line A-A' shown in FIG. 2.

In FIGS. 1 and 2, only the conductive parts are shown for facilitating visualization, and illustration of the insulating parts is omitted. Moreover, in FIG. 2, for facilitating visualization with avoiding overlapping of lines, the sizes of the respective parts are shown slightly differently from those of FIG. 1. This is the same in FIGS. 8, 9, and 10.

As shown in FIG. 1, in the nonvolatile semiconductor memory device 1 (hereinafter, also simply referred to as "device 1") according to this embodiment, an impurity diffusion layer is formed on an upper part of a silicon substrate 11, and this is a back gate 12. Moreover, as shown in FIGS. 1 and 3, on the silicon substrate 11, an insulating film 13 is provided, and on the insulating film 13, a plurality of electrode films 14 and a plurality of insulating films 15 are alternately stacked. As described later, the electrode film 14 is made of, for example, polysilicon, and functions as a control gate (CG) of the memory cell. On the other hand, the insulating film 15 is made of, for example, silicon oxide ($SiO_2$) and functions as an interlayer insulating film insulating the electrode films 14 one another. By the plurality of the electrode films 14 and the plurality of the insulating films 15, a stacked body 19 is composed.

Hereinafter, in this specification, for the convenience of the explanation, an XYZ orthogonal coordinate system is introduced. In this coordinate system, two directions parallel to the upper surface of the silicon substrate 11 and orthogonal to each other are set to be the X direction and the Y direction, and the direction orthogonal to both the X direction and the Y direction, namely, the stacking direction of the electrode films 14 and the insulating films 15 is set to be the Z direction.

On the stacked body 19, an insulating film 16, a selection gate electrode 17, and an insulating film 18 are film-formed in this order. The selection gate electrode 17 is formed by a conductive film made of, for example, polysilicon being divided in the Y direction, and the selection gate electrodes 17 are a plurality of wire-shaped conductive members extending in the X direction. Moreover, electrode film 14 is formed by a conductive film made of, for example, polysilicon being divided in the Y direction, the electrode films 14 are a plurality of wire-shaped conductive members extending in the X direction. The electrode films 14 are divided for each of the selection gate electrodes 17, and in the immediately lower region of one selection gate electrode 17, the electrode films 14 of the respective stages are arranged in a multistage configuration. That is, the electrode films 14 are arranged in a matrix form in the YZ plane and are separate from one another.

And, as shown in FIGS. 1 to 3, in the stacked body 19, and in the insulating film 16, the selection gate electrode 17, and the insulating film 18, a plurality of through-holes 21 extending in the stacking direction (Z direction) are formed. The through-holes 21 are arranged in a matrix form along the X direction and the Y direction, and the arrangement periods thereof in the X and Y directions are constant in the X and Y directions, respectively. A plurality of through-holes 21 arranged in one row along the X direction pass through one selection gate electrode 17. Therefore, the through-holes 21 arranged in the X direction pass through the same selection gate electrode 17 and the same electrode films 14. However, the through-holes 21 arranged in the Y direction pass through the selection gate electrodes 17 different from one another and the electrode films 14 different from one another. Moreover, each of the through-holes 21 passes through the entirety of the stacked body 19, but does not pass through the back gate 12.

Moreover, in the insulating film 13, a communication hole 22 is formed so that a lower end of one through-hole 21 is communicated with a lower end of another through-hole 21 disposed in the position separate by one row in the X direction and by one row in the Y direction (hereinafter, referred to as "diagonal position") when seen from the one through-hole 21. Thereby, one continuous U-shaped hole 23 is formed by one pair of through-holes 21 arranged in the positions diagonal to each other and the communication hole 22 causing the through-holes to communicate with each other. Each of the through-holes 21 is necessarily communicated with another through-hole 21 through the communication hole 22, and therefore, in the stacked body 19, a plurality of U-shaped holes 23 are formed.

In the example shown in FIG. 3, the communication hole 22 is formed in the insulating film 13, the lower surface of the communication hole 22 contacts the back gate 12, and the side surface thereof does not contact the back gate 12. However, other than that, as an arrangement of the communication hole 22, the communication hole 22 may be formed so as to engrave the back gate 12, and the entirety of the lower surface and one part of the side surface of the communication hole 22 may be in contact with the back gate 12. Moreover, the communication hole 22 may be formed to be completely buried in the back gate 12, and the entirety of the lower surface and the entirety of the side surface of the communication hole 22 may be in contact with the back gate 12. In this case, the insulating film 13 becomes needless, and the insulation between the back gate 12 and the lowermost electrode film 14 is ensured by the insulating film 15.

And, on an inner surface of the part located inside the stacked body 19 in the U-shaped hole 23, an ONO film (Oxide Nitride Oxide film) 24 is provided. In the ONO film 24, a block insulating layer 25 with insulating property, a charge storage layer 26, and a tunnel layer 27 with insulating property are stacked in the order from the outside. The block insulating layer 25 contacts the insulating film 13, the insulating film 14, and the insulating film 15. The block insulating layer 25 and the tunnel layer 27 are made of, for example, silicon oxide ($SiO_2$), and the charge storage layer 26 is made of, for example, silicon nitride (SiN). On the other hand, on a portion of the inner surface of the U-shaped hole 23 locating in the insulating film 16, the selection gate electrode 17, and the insulating film 18, a gate insulating film 28 is provided.

Inside the U-shaped hole 23, a semiconductor doped with impurities, for example, polysilicon is buried. Thereby, in a part corresponding to the inside of the stacked body 19 in the inside of the through-hole 21, a silicon pillar 31 made of, for example, polysilicon is formed. Moreover, in a part corresponding to the inside of the insulating film 16, the selection gate electrode 17, and the insulating film 18 in the inside of the through-hole 21, a silicon pillar 34 made of, for example, polysilicon is formed. The upper end of the silicon pillar 31 is connected to the lower end of the silicon pillar 34. The shape of the silicon pillars 31 and 34 is a columnar shape, for example, a circular cylindrical shape, extending in the Z direction.

Moreover, inside the communication hole 22, a connective member 32 made of, for example, polysilicon is formed. The shape of the connective member 32 is a columnar shape, for example, a quadrangular prism shape, extending in the direction orthogonal to the stacking direction (Z direction) and diagonal to both the X direction and the Y direction (hereinafter, referred to as "diagonal direction"). The connective member 32 connects the lower end of one silicon pillar 31 and the lower end of another silicon pillar 31. Seen from the Z direction, the connective members 32 are arranged along both the X direction and the Y direction. The connective members 32 are separate from one another. However, seen from the X direction, the adjacent connective members 32 are seen to overlap. On the other hand, when seen from the Y direction, the adjacent connective members 32 are seen not to overlap.

And, one pair of the silicon pillars 31 and the connective member 32 formed in the same U-shaped hole 23 are formed integrally by the same material, for example, polysilicon and form one U-shaped silicon member 33. Therefore, the U-shaped silicon member 33 is continuously formed seamlessly along the longitudinal direction. Moreover, one pair of the silicon pillars 31 belonging to the same U-shaped silicon member 33, namely, one pair of the silicon pillars 31 connected to each other through the connective member 32 are separate from each other in the X direction and the Y direction and pass through the electrode films 14 different from each other. Moreover, one pair of the silicon pillars 34 connected respectively to the one pair of the silicon pillars 31 pass through the selection gate electrodes 17 different from each other.

On the insulating film 18, a plurality of bit lines BL extending in the direction (Y direction) orthogonal to the direction (X direction) in which the selection gate electrode 17 extends are provided. In FIGS. 2 and 3, the signs "BL" and "bBL" are appended to the bit lines. However, as described later, the distinction between "bit line BL" and "bit line bBL" is generated in the operation, and they are the same in structure. That is, according to the stage of operation, one bit line can be a "bit line BL" or a "bit line bBL". The bit line is formed by a stacked film of, for example, tungsten (W) and titanium nitride (TiN). A metal film made of, for example, aluminum (Al), copper (Cu), or the like, or a stacked film containing them can also be used. In the present specification, "metal" includes an alloy as well as a pure metal. Each of the bit lines BL is disposed so as to pass through the immediately upper region of each row of the silicon pillars 34 arranged along the Y direction and is connected to the upper ends of the respective silicon pillars 34. That is, one row of the silicon pillars 34 arranged along the Y direction are connected to the same bit line BL.

Moreover, as described above, the connective member 32 is for connecting one pair of the silicon pillars 31 each other, which are located in the positions separate from each other by one row in both the X direction and the Y direction, and therefore, the U-shaped silicon member 33 including the connective member 32 is connected between one pair of the bit lines BL adjacent in the Y direction. And, all of a plurality of the connective members 32 commonly connected to one bit line BL are commonly connected to another bit line BL. That is to say, a plurality of bit lines BL formed in the device 1 are grouped into two adjacent bit lines, and the bit lines BL belonging to the same group are connected to each other by the plurality of the U-shaped silicon members 33. However, the bit lines belonging to the different groups are not connected by the U-shaped silicon members 33. Therefore, the connective members 32 connected between the bit lines BL belonging to the same group are arranged along the direction in which the bit lines BL extend, namely, the Y direction.

Next, operation of the nonvolatile semiconductor memory device 1 according to this embodiment will be described.

Figure 4:
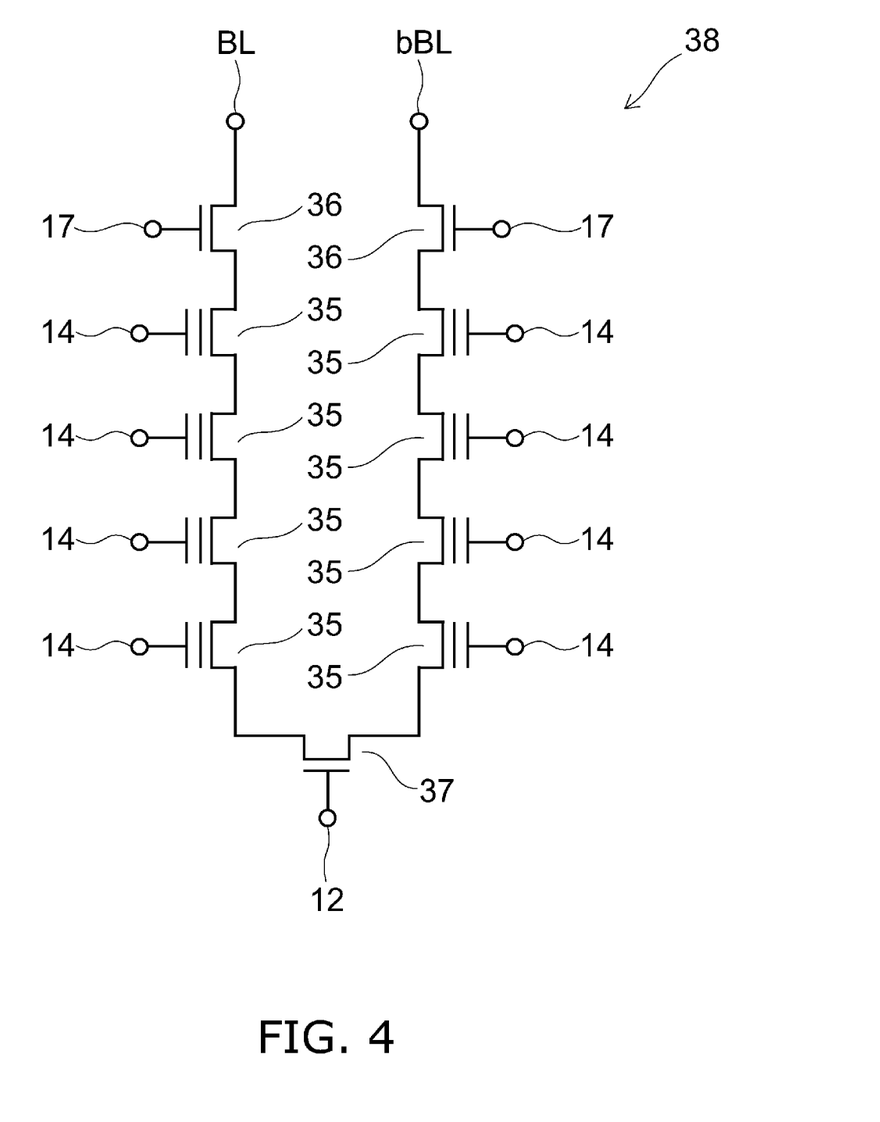
FIG. 4 is a circuit view illustrating one memory string of the nonvolatile semi-conductor memory device according to the first embodiment.

FIG. 4 is a circuit view illustrating one memory string of the nonvolatile semi-conductor memory device according to this embodiment.

As shown in FIGS. 1 to 4, in the device 1, the silicon pillar 31 functions as a channel, and the electrode film 14 functions as a control gate and the charge storage layer 26 functions as a floating gate, thereby, a vertical transistor serving as the memory cell 35 is formed in the intersectional part between the silicon pillar 31 and the electrode film 14. Here, the vertical transistor represents a transistor having a structure in which the semiconductor pillar serving as a body of the transistor is perpendicular to the substrate surface and the gate electrode is provided so as to surround the semiconductor pillar. In the stacked body 19, a plurality of the silicon pillars 31 are arranged in a matrix form along the X direction and the Y direction, and therefore, a plurality of memory cells are arranged three-dimensionally along the X direction, the Y direction, and the Z direction.

Moreover, in the intersectional part between the silicon pillar 34 and the selection gate electrode 17, a selection transistor 36 is configured so that the silicon pillar 34 serves as a channel, the selection gate electrode 17 serves as a gate electrode, and the gate insulating film 28 serves as a gate insulating film. The selection transistor 36 is also a vertical transistor similarly to the above-described memory cell 35.

Furthermore, between the connective member 32 and the back gate 12, the ONO film 24 lies, and therefore, a back gate transistor 37 is configured so that the connective member 32 serves as a channel, the back gate 12 serves as a gate electrode, and the ONO film 24 serves as a gate insulating film. That is, the back gate 12 functions as an electrode for controlling the conduction state of the connective member 32 by an electric field.

As a result, as shown in FIG. 4, one memory string 38 connected between the bit lines BL of one pair is formed along one U-shaped silicon member 33 and one pair of silicon pillars 34 (see FIG. 1) connected thereto. In the memory string 38, selection transistors 36 are provided at both ends, the back gate transistor 37 is provided in the central part, and the memory cells 35 of the same number as the stacking number of the electrode films 14 are serially connected between each of the selection transistors 36 and the back gate transistor 37. That is, a plurality of the memory cells 35 arranged three-dimensionally in the stacked body 19 are bundled as the memory strings 38 for the respective U-shaped silicon members 33.

Hereinafter, writing operation, reading operation, and erasing operation of data in the device 1 will be explained in detail.

In the device 1, in the reading operation, one pair of the bit lines BL connected by the U-shaped silicon members 33 are driven as one set. That is, one of the two bit lines BL belonging to each pair is set to be the bit line BL and the other thereof is set to be the bit line bBL. And, the back gate 12 sets the connective member 32 to be in a conduction state to connect one pair of the silicon pillars 31 to each other, and the bit line BL and the bit line bBL are driven as a pair and the U-shaped silicon member 33 is operated as a driving unit.

On the other hand, in the writing operation, the back gate 12 sets the connective member 32 to be in a non-conduction state, and one pair of the silicon pillars 31 constituting part of the U-shaped silicon member 33 are individually driven. That is, the back gate transistor 37 of the memory string 38 is set to be in an OFF state, and the bit line BL and the bit line bBL are driven independently with no distinction, and thereby, each of the silicon pillars 31 is operated as a driving unit. As described above, the back gate 12 sets the connective member 32 to be in a non-conduction state in the writing operation of the device 1, and sets the connective member 32 to be in a conduction state in the reading operation. Also, in the erasing operation, it is desirable that the potential of the back gate 12 is held to be a low potential such as the reference potential VSS. In the case of the erasing operation, because holes are supplied into the silicon pillar 31, holes also exist in the connective member 32.

In the examples to be described below, the vertical transistor constituting each of the memory cells 35 is set to be an n-channel type transistor. Moreover, a state in which electrons are stored in the charge storage layer 26 of the memory cell 35, the threshold of the n-channel transistor rises, and a current does not flow is set to be the value "0". When the gate potential of the memory cell 35, namely, the potential of the electrode film 14 is the reference potential VSS, if the value of the memory cell is "0", a current is assumed not to flow, and if the value is "1", a current is assumed to flow. And, in the erasing operation, electrons are removed from the charge storage layers 26 of all of the memory cells, and the value is set to "1".

Writing Operation

In the initial state, the values of all of the memory cells are "1". And, an optional memory cell is selected one by one, and the value "0" is written.

As shown in FIG. 2, first, the potential of all of the bit lines BL and bBL are set to the reference potential VSS. The reference potential VSS is, for example, an earth potential. Moreover, the potential of the back gate 12 is set to be OFF potential, and the back gate transistor 37 is set to be in an OFF state. Thereby, the connective member 32 becomes in a non-conduction state, and one pair of the silicon pillars 31 constituting part of the U-shaped silicon member 33 are electrically separated from one another.

Next, the potential of one selection gate electrode 17 is set to be ON potential, and the potential of the entire residual selection gate electrodes 17 are set to be OFF potential. Thereby, only the selection transistor 36 including the selection gate electrode 17 set to ON potential enters an ON state, and the residual selection transistors 36 enter an OFF state. As a result, the potential VSS of the bit line is applied to the silicon pillars 31 corresponding to the selection gate electrode 17 set to ON potential, namely, the silicon pillars 31 arranged in one row along the X direction, and the potential of the residual silicon pillars 31 becomes floating. As a result, the Y coordinate of the memory cell to be written on is selected.

Next, the potential of the bit line connected to the silicon pillars 31 not including the memory cell to which the value "0" will be written out of the silicon pillars 31 whose above selection transistors 36 are set to be in an ON state is set to be in the high-level. Thereby, the drain potential of the selection transistors 36 of the silicon pillars 31 to which the value "0" is not written rises and the gate potential relatively lowers. As a result, the selection transistors 36 enter an OFF state, and the silicon pillars 31 are separated electrically from the bit line and become floating. On the other hand, in the silicon pillar 31 to which the value "0" is written, the potential of the silicon pillar 31 is fixed to the reference potential VSS, because the selection transistor 36 remains in an ON state. As a result, the X coordinate of the memory cell to be written on is selected.

Next, the potential of each of the electrode films 14 is raised to the ON potential Vpass in which each of the memory cells 35 enters an ON state. As a result, the entirety of the silicon pillar 31 to which the above value "0" is written, namely, the silicon pillar 31 whose potential is fixed to the reference potential VSS becomes in a conduction state. Then, the potential of the electrode film 14 corresponding to the memory cell to which the value "0" is written is raised to the writing potential Vpgm that is higher than the ON potential Vpass. Thereby, the Z coordinate of the memory cell to be written on is selected. In the memory cell, by the potential difference (Vpgm−VSS) between the silicon pillar 31 and the electrode film 14, electrons are stored in the charge storage layer 26, and the value "0" is written.

As described above, in the writing operation, by setting the back gate transistor 37 to be in an OFF state and electrically separating the two silicon pillars 31 of the U-shaped silicon member 33, the bit lines BL and bBL can be driven with no distinction, and each of the silicon pillars 31 can be controlled not as a pair but individually. Thereby, while the silicon pillars 31 constituting each pair are connected to each other by the connective member 32, completely independent writing operation becomes possible.

Reading Operation

In the reading operation, for each of the pair pertaining to the bit lines BL and bBL, the value of the memory cell can be read. That is, from a plurality of the memory strings 38 connected to a pair of the bit lines different from each other, the data can be read in parallel. However, in the plurality of the memory strings 38 to be read in parallel, the U-shaped silicon members 33 thereof are required to pass through one common pair of the selection gate electrodes 17.

First, the potential of all of the bit lines BL and bBL is set to be the reference potential VSS. Moreover, the potential of the back gate 12 is set to be ON potential and thereby the back gate transistor 37 is set to be in an ON state. Thereby, the connective member 32 becomes in a conduction state, and a pass-through current becomes in a state of being capable of flowing through the U-shaped silicon member 33. Furthermore, the potential of all of the selection gate electrodes 17 are set to be OFF potential and thereby the selection transistors 36 are set to be in an OFF state.

Next, the selection gate electrode 17 (hereinafter, for convenience, referred to as "selection gate electrode bSG") on the bit line bBL side of the memory string 38 (hereinafter, for convenience, referred to as "memory string 38a") including the memory cell 35 (hereinafter, referred to as "selected cell") to be read is set to ON potential. Thereby, the selection transistor 36 on the bit line bBL side of the memory string 38a enters an ON state, and the U-shaped silicon member 33 thereof is connected to the bit line bBL, and its potential (body potential) becomes the reference potential VSS.

In this case, all of the selection transistors 36 corresponding to the selection gate electrode bSG enter an ON state, and also in a memory string (hereinafter, for convenience, referred to as "memory string 38b") whose end on the bit line BL side passes through the same selection gate electrode bSG, out of the memory strings 38 connected to the same pair of the bit lines as the memory string 38a to be read, the selection transistor 36 on the bit line BL side enters an ON state, and the potential of the U-shaped silicon member 33 becomes the reference potential VSS.

Next, the potential of the electrode 14 corresponding to the selected cell is set to be the reference potential VSS. Thereby, if the value of the selected cell is "0", no currents flow through this selection cell, and if the value is "1", a current flows therethrough. Moreover, the potential of the electrode films 14 except therefor is raised to the potential Vread. The potential Vread is a potential in which a current flows in either case that the value of the memory cell is "0" or "1".

And, with holding the potential of the bit line bBL to be the reference potential VSS, the potential of the bit line BL is raised to the potential Vdread. Moreover, the potential of the selection gate electrode 17 (hereinafter, for convenience, referred to as "selection gate electrode SG") on the bit line BL side in the memory string 38a is set to be ON potential. Thereby, voltage is applied between both ends of the memory string 38a, the selection transistors 36 of the both ends enter an ON state, and the memory cells except for the selected cell become in a conduction state. Therefore, if the value of the selected cell is "1", a current flows between the bit line BL and the bit line bBL through the memory string 38a, and if the value of the selected cell is "0", no currents flow. Therefore, by detecting the current or the voltage between the bit line BL and the bit line bBL, the data of the selected cell can be read.

In this case, also in a memory string (hereinafter, for convenience, referred to as "memory string 38c") which is connected to the same pair of the bit lines as the memory string 38a and in which the above selection gate electrode SG constitutes part of the selection transistor 36 on the bit line bBL side, the selection transistor 36 on the bit line bBL side enters an ON state. Therefore, also in each of the memory strings 38b and 38c, the selection transistor 36 of one end enters an ON state. However, because the selection transistor 36 of the other end remains in an OFF state, no currents flow through the memory strings 38b and 38c.

As described above, in the reading operation, a state in which a pass-through current flows through the memory string 38 can be realized by setting the back gate transistor 37 to be in an ON state, and reading of an optional memory cell becomes possible by using the bit line bBL like a source line. Moreover, when the potentials of the selection gate electrodes SG and bSG are set to be ON potentials, the body potentials (potentials of the U-shaped silicon members 33) of the memory strings 38a, 38b, and 38c corresponding to these selection gate electrodes fluctuate. However, in the non-selected memory strings 38b and 38c, one selection gate electrode 17 is necessarily becoming in an OFF state, and therefore, no pass-through currents flow and the sensing operation during reading is not affected.

In reading the value of the memory cell belonging to the memory string 38b, the selection gate electrode 17 set to be the selection gate electrode bSG in the above operation is set to be the selection gate electrode SG, and the selection gate electrode 17 corresponding to the other end of the memory string 38b is set to be the selection gate electrode bSG. Similarly, in reading the value of the memory cell belonging to the memory string 38c, the selection gate electrode 17 set to be the selection gate electrode SG in the above operation is set to be the selection gate electrode bSG, and the selection gate electrode 17 corresponding to the other end of the memory string 38c is set to be the selection gate electrode SG.

Erasing Operation

First, the potentials of all of the bit lines BL and bBL, the selection gate electrodes 17, the electrode films 14, and the back gates 12 are dropped to be the reference potential VSS. Thereby, the conductive members 32 become in a non-conduction state for electrons, and one pair of the silicon pillars 31 constituting part of the U-shaped silicon member 33 are electrically separated from each other.

Next, the potentials of the bit lines BL and bBL are gradually raised toward the erasing potential Verase that is higher than the reference potential VSS. After raising this potential, the potential of the selection gate electrode 17 is raised. Thereby, a strong electric field is applied to the end of the diffusion layer of the selection transistor 36 to generate holes, the holes are injected into the charge storage layers sequentially from the memory cell on the selection transistor 36 side, and thereby, the stored charges are erased. Moreover, therewith, the body potential, namely, the potential of the silicon pillar 31 rises.

Finally, the body potential rises to the vicinity of the erasing potential Verase, and charges are erased in all of the memory cells. That is, the values of the all of the memory cells become "1". Thereby, the erasing operation is completed.

As described above, also in the erasing operation, similarly to the writing operation, each of the silicon pillars 31 can be operated as a driving unit. It is also possible, for example, that only the potential of the bit line bBL is raised to the erasing potential Verase, and the bit line BL is separated from the sense amplifier and set to be floating. Also in this case, the back gate transistor may be set to be in an OFF state. However, it is necessary that the generated holes are injected into a pair of the silicon pillars 31 through the connective member 32. Moreover, in particular, in the erasing operation, it is necessary to be careful not to apply voltage larger than the breakdown voltage to the gate insulating film of the selection gate electrode.

Next, a method for manufacturing the nonvolatile semiconductor memory device 1 according to this embodiment will be described.

Figure 5:
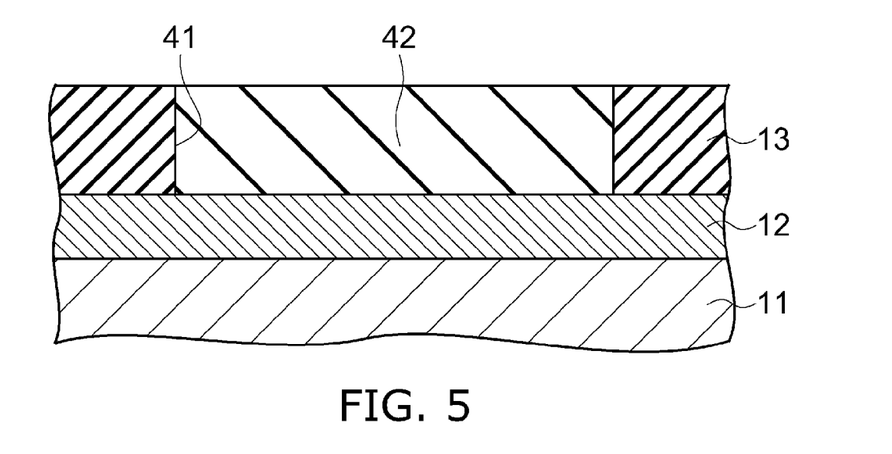
FIG. 5 is a cross-sectional view of steps illustrating the method for manufacturing the nonvolatile semiconductor memory device according to the first embodiment.
Figure 6:
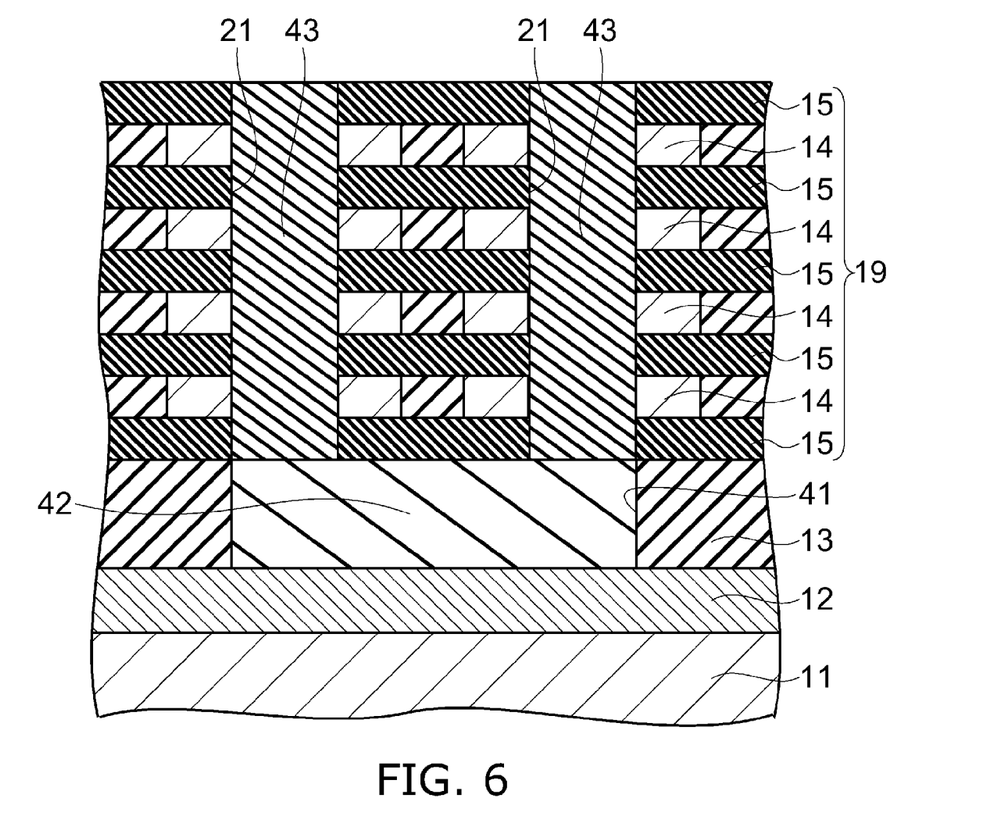
FIG. 6 is a cross-sectional view of steps illustrating the method for manufacturing the nonvolatile semiconductor memory device according to the first embodiment.

FIGS. 5 and 6 are cross-sectional views of steps illustrating the method for manufacturing the nonvolatile semiconductor memory device according to this embodiment.

FIGS. 5 and 6 show cross-sections corresponding to FIG. 3.

First, as shown in FIG. 5, impurities are introduced into some region in an upper part of a silicon substrate 11 and thereby the back gate 12 is formed. Next, the insulating film 13 is deposited on the silicon substrate 11 and flattened. Next, a portion of the insulating film 13 is removed by etching to form an opening 41. Viewed from the Z direction, the shape of the opening 41 is set to be a reed shape extending in the diagonal direction, namely, the direction parallel to the XY plane and inclined to both the X direction and the Y direction. And, silicon nitride (SiN), for example, is deposited on the entire surface thereof, and by CMP (Chemical Mechanical Polishing), the silicon nitride deposited on the insulating film 13 is removed, and thereby, sacrificial material 42 made of silicon nitride is buried inside the opening 41.

Next, as shown in FIG. 6, on the insulating film 13 and the sacrificial material 42, the insulating films 15 and the electrode films 14 are alternately stacked to form the stacked body 19. Next, by performing lithography and etching, through-holes 21 reaching the insulating film 13 are formed in the stacked body 19. The through-holes 21 are formed in a matrix form so as to reach both ends of the sacrificial material 42.

And, silicon nitride (SiN), for example, is deposited on the entire surface thereof, and the silicon nitride deposited above the insulating film 13 is removed by performing CMP, and thereby, the sacrificial materials 43 made of silicon nitride are buried in the through-holes 21. The sacrificial materials 43 contact both ends of the sacrificial material 42.

Next, as shown in FIG. 3, by wet etching using a thermal phosphoric acid solution, for example, the sacrificial materials 43 and 42 (see FIG. 6) are removed. Thereby, the opening 41 becomes the communication hole 22 causing both of the lower ends of one pair of the through-holes 21 to communicate with each other, and thereby, one continuous U-shaped hole 23 is formed.

Next, on the entire inner surface of the U-shaped hole 23, the block insulating layer 25, the charge storage layer 26, and the tunnel layer 27 are film-formed in this order, and thereby, the ONO film 24 is formed. Next, inside the U-shaped hole 23, polysilicon is buried to form the U-shaped silicon member 33 collectively. In this case, the polysilicon buried in the through-holes 21 form silicon pillars 31 and the polysilicon buried in the communication holes 22 form the connective members 32.

Next, on the stacked body 19, the insulating film 16 made of, for example, silicon oxide is formed, the selection gate electrodes 17 made of, for example, polysilicon are formed, and the insulating film 18 made of, for example, silicon oxide, is formed.

Next, in the immediately upper regions of the silicon pillars 31 in the insulating film 16, the selection gate electrodes 17, and the insulating film 18, through-holes are formed, and on the inner surfaces thereof, the gate insulating films 28 are formed. And, inside the through-holes, polysilicon is buried, for example. Thereby, on each of the silicon pillars 31, the silicon pillar 34 made of polysilicon and connected to each of the silicon pillars 31 is formed. Then, a metal film is formed on the insulating film 18 and patterned to bit lines BL to be connected to the upper ends of the silicon pillars 34. Thereby, the nonvolatile semiconductor memory device 1 is manufactured.

Next, the effect of this embodiment will be described.

In this embodiment, both ends of the U-shaped silicon member 33 are connected to the upper-layered bit lines BL through one pair of the silicon pillars 34, and the U-shaped silicon member 33 is not connected to a conductive member formed in a lower layer than the U-shaped-silicon member 33. Moreover, the lower part of the U-shaped silicon member 33 is seamlessly formed integrally through the connective member 32 by burying polysilicon inside the U-shaped hole 23. Therefore, differently from the stack-type memory device described in, for example, Patent document 1, it is needless to contact both of the silicons in the lower part of the through-holes 21. Therefore, it is needless to perform pretreatment such as hydrofluoric acid treatment, and the charge storage layers are not damaged by the pretreatment. As a result, the nonvolatile semi-conductor memory device in which reliability of the charge storage layers is high and freedom degree of the film constitution of the charge storage layers is high can be realized.

Moreover, according to this embodiment, differently from the stack-type memory device described in Patent document 1, it is needless to form a source layer to which the lower end of the silicon pillar is connected in the silicon substrate. Moreover, it is also needless to form a source line above the stacked body 19. Therefore, the steps for forming the source layer or the source line become needless, and cost of manufacturing is low.

Furthermore, according to this embodiment, the bit line BL and the bit line bBL can be used evenly. Therefore, in the writing operation and the erasing operation, the bit lines BL and the bit lines bBL can be driven independently with no distinction. Therefore, the operation speed is high.

Moreover, in the reading operation, the bit line BL and the bit line bBL are driven as a pair. However, also in this case, the bit line BL and the bit line bBL can be replaced with each other and driven.

For example, when the stacking number increases and the length of the memory string becomes extremely long, the body potential of the memory cell, namely, the potential of the silicon pillar 31 occasionally fluctuate according to the position of the selected cell in the memory string and thereby the apparent threshold occasionally fluctuate. That is, if the selected cell to be a target of the reading operation is disposed on the drain side of the memory string, namely, on the bit line BL side to which the potential Vdread is applied, a large number of memory cells are serially connected and large parasitic resistance is generated, in a part of the memory string nearer to the source side with respect to the selected cell, namely, in a part between the selected cell and the bit line bBL to which the reference potential VSS is applied. Therefore, the body potential of the selected cell becomes nearer to the potential Vdread than to the reference potential VSS, and by the amount thereof, the gate potential with respect to the body potential relatively lowers. Thereby, apparently, the threshold of the memory cells comes to rise.

By contrast, according to this embodiment, this problem can be avoided by switching the bit lines according to the position of the selected cell on a memory cell. That is, the bit line nearer to the selected cell is set to be the bit line bBL and the reference potential VSS is applied thereto. On the other hand, the bit line farther from the selected cell is set to be the bit line BL, and the potential Vdread is applied thereto. Thereby, the selected cell is always located on the reference potential VSS side, and the parasitic resistance added between the selected cell and the reference potential VSS can be suppressed to be smaller. Thereby, the fluctuation of the threshold can be suppressed. As a result, even when the stacking number is increased, a stable reading operation can be carried out.

Furthermore, according to this embodiment, the electrode films 14 and the selection gate electrodes 17 extend in the X direction, and the bit lines BL extend in the Y direction, and therefore, they are orthogonal. Therefore, in the layout of the device 1, a dead space with a triangular shape is difficult to be generated in a corner part.

Hereinafter, for clarifying the effect of this embodiment, comparative examples will be described.

First, a first comparative example will be described.

Figure 7:
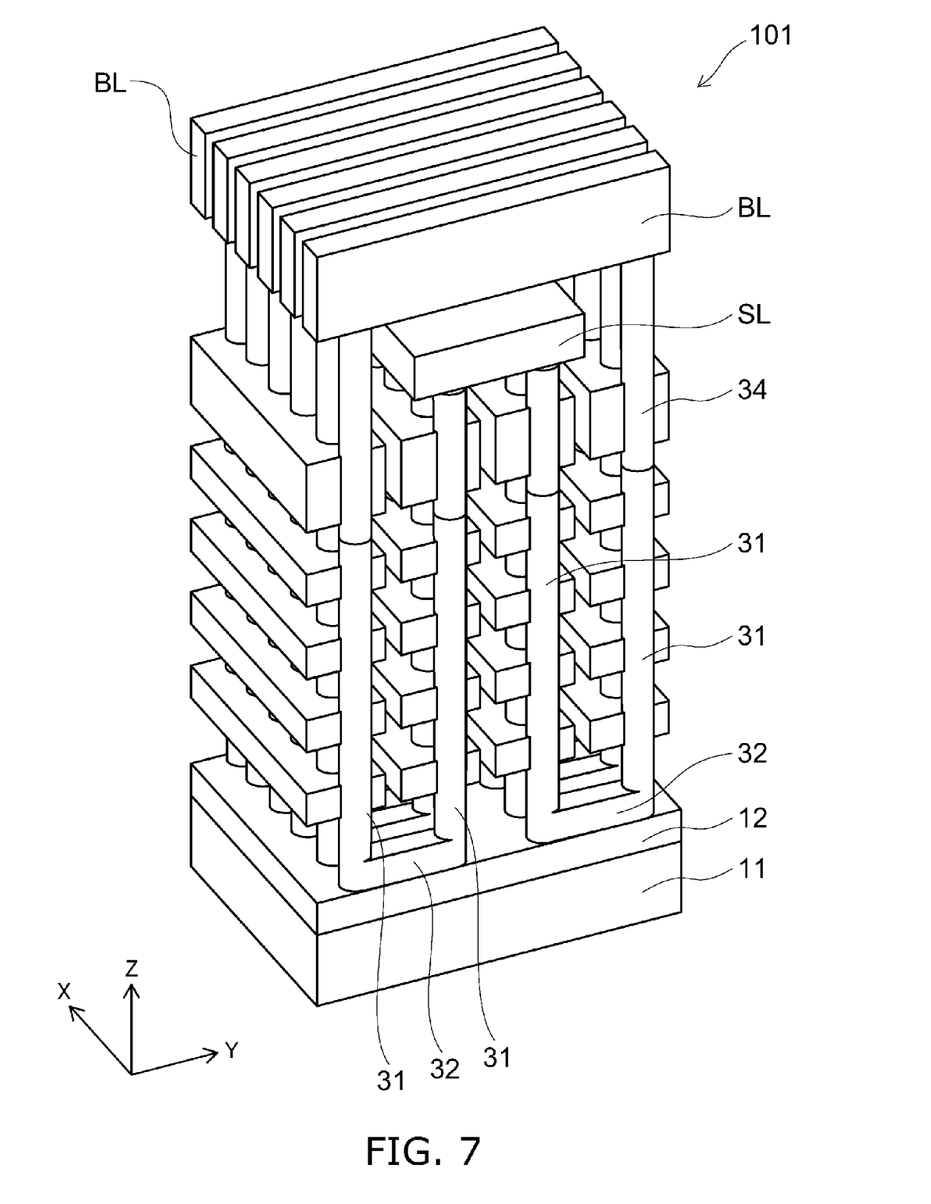
FIG. 7 is a perspective view illustrating the nonvolatile semiconductor memory device according to the first comparative example.
Figure 8:
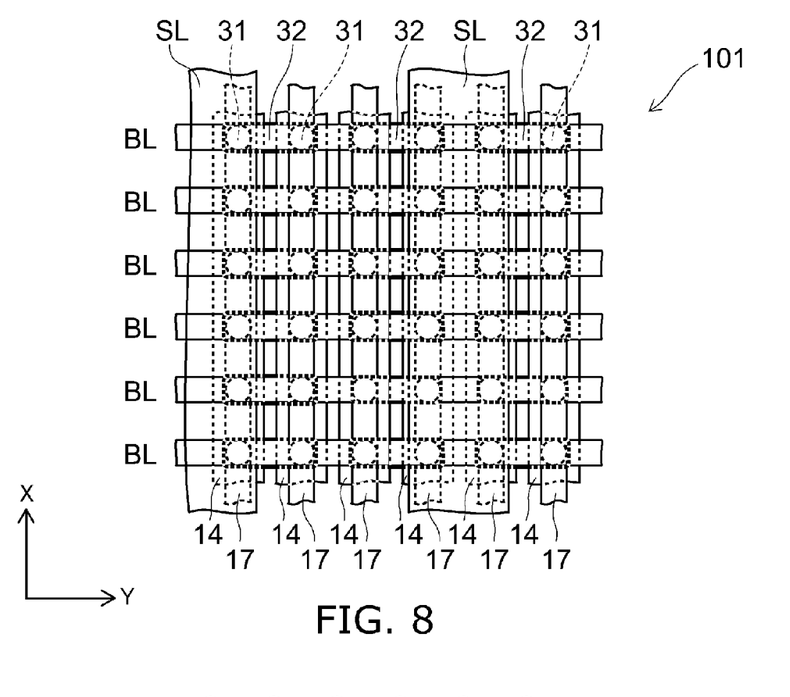
FIG. 8 is a plan view illustrating the nonvolatile semiconductor memory device according to the first comparative example.

FIG. 7 is a perspective view illustrating the nonvolatile semiconductor memory device according to a first comparative example, and FIG. 8 is a plan view illustrating the nonvolatile semiconductor memory device according to the first comparative example.

As shown in FIGS. 7 and 8, in the nonvolatile semiconductor memory device 101 according to this comparative example, differently from the first embodiment, the connective member 32 extends in the Y direction, namely, the direction in which the bit lines BL extend. Thereby, the connective member 32 connects both of the lower ends of one pair of the silicon pillars 31 separate in the Y direction.

Moreover, in the device 101, between the selection gate electrode 17 and the bit line BL, a source line SL is provided. The source line SL extends in the X direction, namely, the direction orthogonal to the bit lines BL. And, the width of the source line SL is larger than the widths of the selection gate electrode 17 and the electrode film 14, and the source line SL is disposed over the immediately upper region of two rows of the silicon pillars 31 arranged in the Y direction, and the two rows of the silicon pillars 31 are connected through the silicon pillars 34. Moreover, the source lines SL are provided in the ratio of one source line SL for four rows of the silicon pillars 31 arranged in the X direction. Thereby, one of the silicon pillars 31 of one pair connected to the connective member 32 is connected to the source line SL, the other thereof is connected to the bit line BL.

The device 101 can also be driven by almost the same driving method as the device 1 according to the first embodiment. In this case, in this comparative example, the source line SL plays the role of the bit line bBL in the first embodiment. Also, in this comparative example, it is needless to contact both of the silicons in the lower part of the through-holes, and therefore, the pretreatment such as hydrofluoric acid treatment is needless and the reliability of the charge storage layers is high.

However, in this comparative example, because the source lines SL are formed, the number of steps increases compared to the first embodiment, and cost of manufacturing comes to rise. Moreover, when data are read at the same time from a plurality of bit lines by setting one selection gate electrode 17 to ON potential, a plurality of the bit lines are connected in parallel through a plurality of the memory strings to one source line. Therefore, a large current comes to flow through the source line, and the potential of the source line becomes easy to fluctuate according to the conduction state of the memory string. For suppressing the fluctuation of the potential, it is necessary to set the resistance of the source line to be lower than the resistance of the bit line. In this case it is necessary to form the source line to be thick, for example.

By contrast, according to the first embodiment, because it is needless to form the source lines, the number of steps can be reduced and cost of manufacturing can be reduced, compared to the first comparative example. Moreover, in the first embodiment, the bit line bBL plays the function played by the source line SL in the first comparative example. However, the bit line bBL constitutes a pair with the bit line BL. Therefore, also when a large number of memory cells are read at the same time, only one bit line BL is connected to one bit line bBL. Thereby, the wiring resistance of the bit line bBL can be the same as the wiring resistance of the bit line BL, and the potential of the bit line bBL does not fluctuate according to the conduction state of another memory string. Therefore, a reading operation with high reliability can be realized.

Next, a second comparative example will be described.

Figure 9:
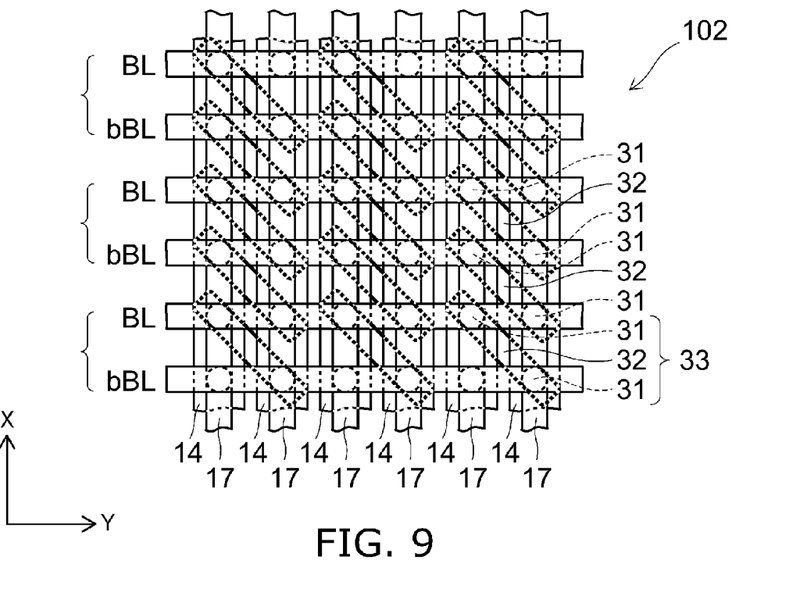
FIG. 9 is a plan view illustrating the nonvolatile semiconductor memory device according to the second comparative example.

FIG. 9 is a plan view illustrating the nonvolatile semiconductor memory device according to a second comparative example.

As shown in FIG. 9, in the nonvolatile semiconductor memory device 102 according to this comparative example, differently from the device 1 according to the first embodiment, a plurality of connective members 32 commonly connected to one bit line BL are not necessarily connected commonly to the same one bit line bBL, but are connected to either of two bit lines bBL arranged on both adjacent sides of the one bit line BL. On the other hand, a plurality of selection gate electrodes 17 of the device 102 are grouped into two adjacent selection gate electrodes 17, and the selection gate electrodes 17 belonging to the same group share a plurality of memory strings, but the selection gate electrodes 17 belonging to the different groups do not share a memory string.

In the device 102, a case of setting the potential of two adjacent selection gate electrodes 17 to be ON potential in the reading operation will be dealt with. When the two selection gate electrodes 17 share the common memory strings 38, all of the selection transistors 36 of both ends of the shared memory strings 38 enter an ON state. Therefore, by the plurality of the memory strings 38 whose both ends are conducted and the bit lines, a spiral-shaped conductive pathway extending in the X direction becomes formed, and thereby, it is impossible to realize a state in which only a particular memory string 38 can be the target to be read. On the other hand, when the two selection gate electrodes 17 do not share the common memory strings 38, the memory string 38 whose both selection transistors 36 of both ends enter an ON state is not generated, and therefore, all the same, the reading operation cannot be carried out. As described above, in the device 102 according to the second comparative example, reading of data is impossible by the same driving method as the first embodiment.

Next, a second embodiment of the invention will be described.

Figure 10:
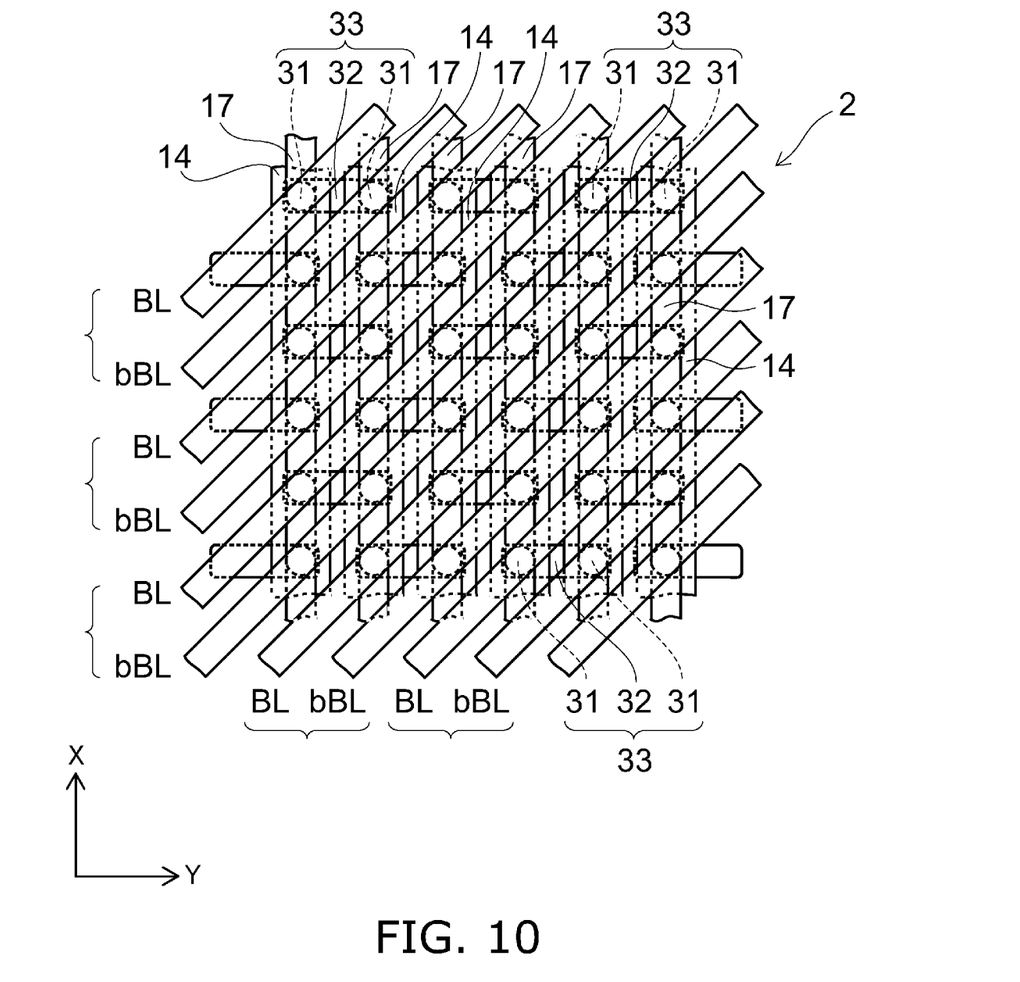
FIG. 10 is a plan view illustrating the nonvolatile semiconductor memory device according to the second embodiment.

FIG. 10 is a plan view illustrating the nonvolatile semiconductor memory device according to this embodiment.

As shown in FIG. 10, the nonvolatile semiconductor memory device 2 according to this embodiment is the same as the device 1 according to the above first embodiment in the point that the electrode films 14, which are control gates, and the selection gate electrodes 17 extend in the X direction. However, in the device 2, the bit lines extend not in the Y direction but in the diagonal direction, namely, the direction parallel to the XY plane and inclined to both the X direction and the Y direction, and the connective members 32 extend not in the diagonal direction but in the Y direction. The structures except therefor in this embodiment are the same as the above first embodiment.

Also by this embodiment, the same effect as the above first embodiment can be obtained. As described above, in the above first embodiment, the example in which the bit lines BL extend in the direction (Y direction) orthogonal to the direction (X direction) in which the selection gate electrodes 17 extend has been shown. However, the direction in which the bit lines BL extend and the direction in which the selection gate electrodes 17 extend are not necessarily orthogonal and have only to intersect each other.

The invention has been described with reference to the embodiments. However, the invention is not limited to the embodiments. For example, the above embodiments that are subjected appropriately by those skilled in the art to addition or deletion of the components or to design modification, or to addition or omission of steps or to condition modification are also included in the scope of the invention as long as having the spirit of the invention. For example, in the above embodiments, the examples in which the bit lines and the selection gate electrodes are formed in line shapes have been shown, but the invention is not limited thereto.

REFERENCE SIGNS LIST 1 and 2 nonvolatile semiconductor memory device
11 silicon substrate
12 back gate
13 insulating film
14 electrode film
15 and 16 insulating film
17 selection gate electrode
18 insulating film
19 stacked body
21 through-hole
22 communication hole
23 U-shaped hole
24 ONO film
25 block insulating layer
26 charge storage layer
27 tunnel layer 28 gate insulating film
31 silicon pillar
32 connective member
33 U-shaped silicon member
34 silicon pillar
35 memory cell
36 selection transistor
37 back gate transistor
38, 38a, 38b, and 38c memory string
41 opening
42 and 43 sacrificial material,
101 and 102 nonvolatile semiconductor memory device
bBL and BL bit line
bSG selection gate electrode
SG selection gate electrode
SL source line

The invention claimed is:

1. A nonvolatile semiconductor memory device comprising:
- a stacked body in which a plurality of insulating films and a plurality of electrode films are alternately stacked;
- a plurality of selection gate electrodes provided on the stacked body;
- a plurality of bit lines provided on the selection gate electrodes;
- a plurality of semiconductor pillars passing through the stacked body and the selection gate electrodes, whose upper ends are connected to the bit lines;
- a plurality of connective members separated from one another, one of the connective members connected between a lower part of a first of the semiconductor pillars and a lower part of a second of the semiconductor pillars; and
- a charge storage layer provided between each of the electrode films and each of the semiconductor pillars,
- each of the electrode films being divided for each of the selection gate electrodes,
- the first of the semiconductor pillars passing through a first of the selection gate electrodes and connected to a first of the bit lines, and
- the second of the semiconductor pillars passing through a second of the selection gate electrodes and connected to a second of the bit lines,
- wherein the selection gate electrode extends in a first direction orthogonal to a stacking direction of the insulating films and the electrode films, the bit line extends in a second direction orthogonal to the stacking direction and intersecting the first direction, and the one of the connective members extends in a direction orthogonal to the stacking direction and inclined to both the first direction and the second direction, and the first of the bit lines and the second of the bit lines are adjacent.

2. The device according to claim 1, wherein one pair of the semiconductor pillars and the one of the connective members which are connected to one another are formed integrally by a same material.

3. The device according to claim 1, wherein the one of the connective members is made of a semiconductor material, and the device further comprises a back gate for controlling a conduction state of the one of the connective members.

4. The device according to claim 3, wherein the back gate sets the one of the connective members to be in a non-conduction state in writing operation and sets the one of the connective members to be in a conduction state in reading operation.

* * * * *